United States Patent
Plunkett

(10) Patent No.: US 7,631,235 B2
(45) Date of Patent: Dec. 8, 2009

(54) TESTING OF INTEGRATED CIRCUITS USING BOUNDARY SCAN

(75) Inventor: Dominic Plunkett, Cambridge (GB)

(73) Assignee: Midas Yellow Ltd., Cambridge (GB)

( * ) Notice: Subject to any disclaimer, the term of this patent is extended or adjusted under 35 U.S.C. 154(b) by 0 days.

(21) Appl. No.: 12/010,755

(22) Filed: Jan. 29, 2008

(65) Prior Publication Data

US 2008/0215942 A1    Sep. 4, 2008

(51) Int. Cl.
*G01R 31/28* (2006.01)
*G06F 11/00* (2006.01)

(52) U.S. Cl. .......................... 714/727; 714/741; 716/4

(58) Field of Classification Search ................ 714/724, 714/726, 727, 741; 716/4
See application file for complete search history.

(56) References Cited

U.S. PATENT DOCUMENTS 6,539,520 B1 *   3/2003  Tiong et al. ..................... 716/3
6,757,844 B1 *   6/2004  Lulla et al. ..................... 714/30
6,988,229 B1 *   1/2006  Folea, Jr. ..................... 714/727

OTHER PUBLICATIONS

IEEE Standard Test Access Port and Boundary-Scan Architecture IEEE Std 1149.1—2001.*

* cited by examiner

*Primary Examiner*—Cynthia Britt
(74) *Attorney, Agent, or Firm*—Holland & Knight LLP

(57) ABSTRACT

Circuit testing equipment comprising a computer (110) having stored thereon a boundary scan description language (BSDL) file (111), a netlist (112) and a connections list (113). An adapter (105) connects the computer to a boundary scan bus of a circuit (120) to be tested. The computer is arranged to parse and compile the BSDL file, the netlist and the connections list to generate a data structure which, when combined with a test script (114), permits execution of the test script from the computer through the boundary scan bus. The test script can be IC-specific such that it is valid for a particular IC independent of the circuit in which the IC is located.

13 Claims, 3 Drawing Sheets

TESTING OF INTEGRATED CIRCUITS USING BOUNDARY SCAN

FIELD OF THE INVENTION

This invention relates to methods and equipment for testing of integrated circuits using boundary scan capability and architecture.

As integrated circuits (ICs) have become smaller and smaller, the ball grid array (BGA) format of pin connection has become popular. BGA circuits have an array of pins on the underside of the IC package and a corresponding array of pads on the surface of a multi-layer printed circuit board (PCB). Between each pin on the IC package and each corresponding pad on the board, there is a ball of solder which, during reflow processing, solders the pin to its corresponding pad. The arrangement has advantages over packages that have their pins around the outside edge of the package, because these latter packages cannot be reduced in size below the minimum separation possible for the pins that extend around the outside edge of the package. By contrast, BGA pins with the same pin separation distance can occupy a smaller package.

It is a problem with BGA circuits that the pins are not individually accessible by test equipment, because they are buried underneath the IC package. An IC itself can be tested using a "bed of nails" test jig, but it is a problem that, in situ, the connection between the BGA chip and its board is difficult to test, because it is inaccessible.

For testing purposes, an IC architecture has been developed referred to as a "boundary-scan architecture" in which each external pin of an IC has a boundary-scan register cell into and out of which can be clocked data for that pin. Running through the IC from pin to pin is a serial databus which permits serial data to be clocked to all the pins of the IC, so that the device connections can be tested using test data serially clocked into the boundary scan register.

FIG. 1 illustrates an example of a circuit board 10 having ICs 111 to 16 mounted thereon. ICs 12 to 15 have the above-described boundary-scan architecture. There is a boundary-scan bus which comprises four lines: a Test Data In (TDI) line, 17, a test data out (TDO) line, a clock line and a test mode select (TMS) line (not shown). In operation, a test is set up by serially clocking data in through the TDI line 17 and, when a complete sequence of data has been clocked in (using the clock line) in readiness for a test, the TMS line is activated and the serial data is loaded in parallel into the ICs of the circuit. Resulting data is clocked out through a Test Data Output (TDO) line 18 and this is tested against expected results to determine the satisfactory connections of the ICs.

Details of boundary-scan architecture and testing can be found in the Standard Test Access Port and Boundary-Scan Architecture Specification, IEEE Standard 1149.1. This architecture is commonly referred to as "JTAG".

Writing test software to perform JTAG testing is extremely complex and labour-intensive. For a given circuit to be tested, the anticipated results clocked out of the serial data output 18 need to be very carefully determined for the specific board being tested and its various integrated circuits, taking into account all the connections between the various ICs and within each IC. Testing is further complicated by the fact that each pin can take one of three states: a high state, a low state, or an input state. Thus, if a given state is read out from the serial data output 18, this alone does not determine whether an IC has driven its pin to that state or that pin has been driven to that state by some other pin. Common faults that need to be identified include connection breaks (for example whether the solder has failed to connect a pin to its pad), connection shorts (e.g. where solder has spilled over to create a short-circuit between pins), and the like. Further complicating matters is the effect of resistors within an IC or between two ICs. A resistor can give the effect of presenting a short-circuit, or it can appear to be an open circuit, depending on how the surrounding pins are being driven. Circuit testing needs to separate out the testing of the functioning of an IC itself and the testing of the connections between the different ICs. JTAG lends itself to testing connections between ICs, but such testing cannot fully be carried out without knowledge of the connections within an IC. This information is generally available from the IC manufacturer, but the circuit designer is still left with a heavy burden in using this information to develop thorough testing.

A further drawback is that ICs that are not in accordance with a boundary-scan architecture specification, for example ICs 11 and 16 in FIG. 1, cannot have their pins driven artificially in a test mode by the JTAG bus. Nevertheless, they cannot be ignored in a testing cycle, because they affect the high and low states of other pins to which they are connected. It would be most useful to use the boundary-scan bus to test ICs that are not connected to that bus.

There is a need to provide an improved method of testing of ICs and their connections, using boundary-scan architecture.

These needs and other needs are fulfilled by the present invention, the various advantages of which will be apparent from the reading of the detailed description of the preferred embodiment set out below.

SUMMARY OF THE INVENTION

According to a first aspect of the invention, circuit testing equipment is provided comprising a computer (which term, in this context, means a personal computer or other computer and includes other computational test means) having stored thereon a boundary scan description language (BSDL) file, a netlist and a connections list. A connector (which term, in this context, may mean a physical connector but may include other connection means such as a test machine that connects to test points) connects the computer to a boundary scan bus of a circuit to be tested. The computer is arranged to parse and compile the BSDL file, the netlist and the connections list to generate a data structure which, when combined with a test script, permits execution of the test script from the computer through the boundary scan bus. The test script can be IC-specific such that it is valid for a particular IC independent of the circuit in which the IC is located.

According to a second aspect of the invention, circuit testing equipment is provided for testing a circuit that has at least one first integrated circuit (IC) that is boundary-scan capable (i.e. it has a boundary-scan register accessed through a test access port), and at least one second IC that is not boundary-scan capable. The equipment has an input for inputting files comprising a boundary scan description language (BSDL) file, a netlist and a connections list and it has a parser and a compiler. These parse and compile the files to generate a data structure that defines all pins of the first IC that are capable of driving pins of the second IC and all pins of the first IC that are capable of reading pins of the second IC. In this manner, the second IC and its connections to the first IC can be tested by driving pins of the first IC.

In accordance with the invention, a method of testing an integrated circuit board having a boundary scan test port is also provided. The method comprises: connecting a computer to the boundary scan test port; loading and parsing a boundary scan description language (BSDL) file, a netlist and a connections list in the computer and compiling these into a data structure for testing a circuit on the board; loading a test script specific to an integrated circuit (IC) mounted on the board; and running the test script using the data structure to thereby send to the boundary scan test port selected signals which will test selected pins of the integrated circuit.

In the development of integrated circuit boards, this method can be performed on a first board, and when the results are reviewed, a derivative board and its associated netlist can be created, and, without changing the test script, the test method can be performed again on the derivative board.

The invention facilitates the creation of test scripts for testing of integrated circuits using boundary-scan architecture, and in particular the development of test scripts that are specifically suited to individual ICs and that can be operated for a given IC, or a given IC and access type, regardless of the connections for that IC when it is connected to a circuit board.

DETAILED DESCRIPTION OF THE PREFERRED EMBODIMENT

Figure 1:
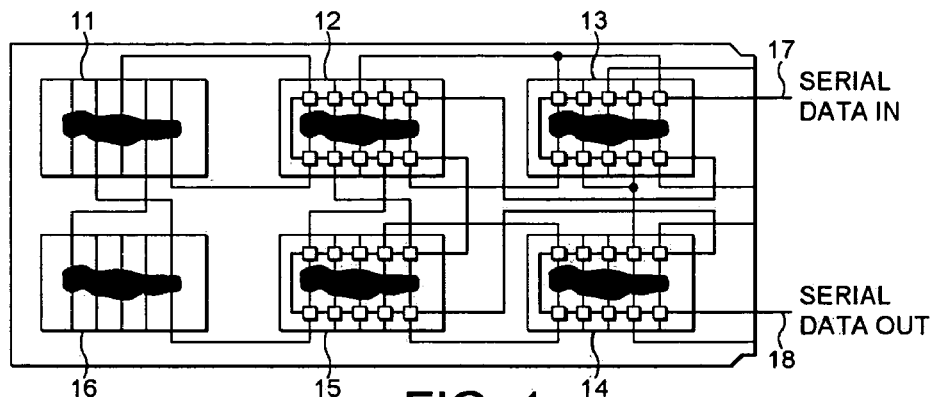
FIG. 1 is a diagrammatic representation of a prior art circuit board to be tested using JTAG techniques.
Figure 2:
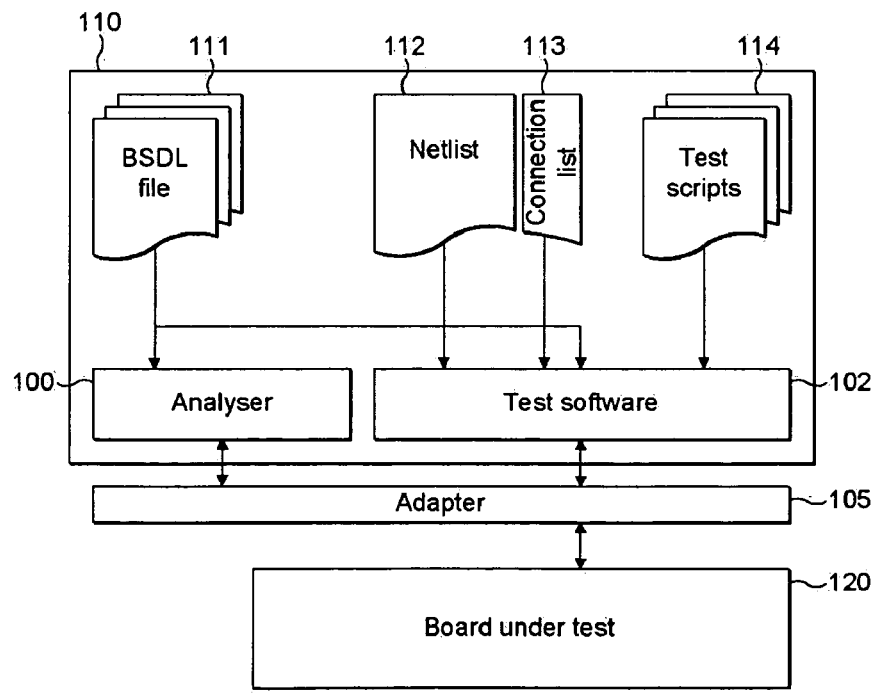
FIG. 2 is an overall block diagram of the files, software and hardware of the present invention connected to a circuit board to be tested.

Referring to FIG. 2, the equipment of the present invention comprises analyser software 100 and test software 102, which are run on a computer 110 that is connected via an adapter 105 to a board 120 that is to be tested. The test software 102 is stored in a high level language as described below. Loaded into the computer 100 are boundary-scan description language (BSDL) files 111, a netlist 112 and a set of test scripts 114. Beside the netlist 112 is shown a connections list 113.

Each BSDL file 111 is supplied by the manufacturer of a particular IC and defines, for that IC the manner in which JTAG is implemented. BSDL files contain the following elements:

Entity Description: Statements naming the device or a section of its functionality.
Generic Parameter: A value such as a package type. The value may come from outside the current entity.
Port Description: Describes the nature of the pins on the device (input, output, bidirectional, linkage).
Use Statements: References external definitions (such as IEEE 1149.1).
Pin Mapping(s): Maps logical signals in the device to physical pins.
Scan Port Identification: Defines the pins used on the device to access the JTAG capabilities (TDI, TDO, etc—the Test Access Port).
Instruction Register Description: The signals used for accessing JTAG device modes.
Register Access Description: Which register is placed between TDI and TDO for each JTAG instruction.
Boundary Register Description: List of the boundary scan cells and their functionality.

The netlist 112 is a list of "nets" for the printed circuit board (PCB), where each net defines a connection between two or more connections on the PCB. For example a net may be a single connection between a pin of one IC and a pin of another IC, or it may be a three-way connection between pins of ICs and a third point such as a resistor or a switch or other discrete component. A net may comprise many connections between IC pins, inputs, outputs and other components. A complete netlist defines all the connections for a PCB. The connections list 113 defines further connections that are not in the PCB, for example external wire connectors which connect together different connections on the PCB, or resistor elements that serve the same function.

The scripts 114 are a series of test programs specific to individual ICs. A given IC may have one or more scripts, but a given script will serve to test only one IC (or all ICs of an identical type). The scripts are new and are described below. They can be generated and supplied by IC manufacturers or end users of ICs. When selling an IC, the manufacturer can supply a script for testing that IC.

The analyser software 100 is a tool for circuit visualisation and debugging. It provides a graphical view of a JTAG chain, illustrating, on a pin-by-pin basis, both the pin state and pin value. It has the facility to run serial vector format files representing JTAG test patterns as plain text.

The test engine 102 implements a JTAG chain in a manner described in greater detail below and performs JTAG device testing and non-JTAG testing. It generates the serial data to be clocked into a JTAG bus and reads back the results and determines the pass or fail status of a given test and what action is to be taken as a result.

The adapter 105 is a USB-to-JTAG converter that need not be described in detail.

Figure 3:
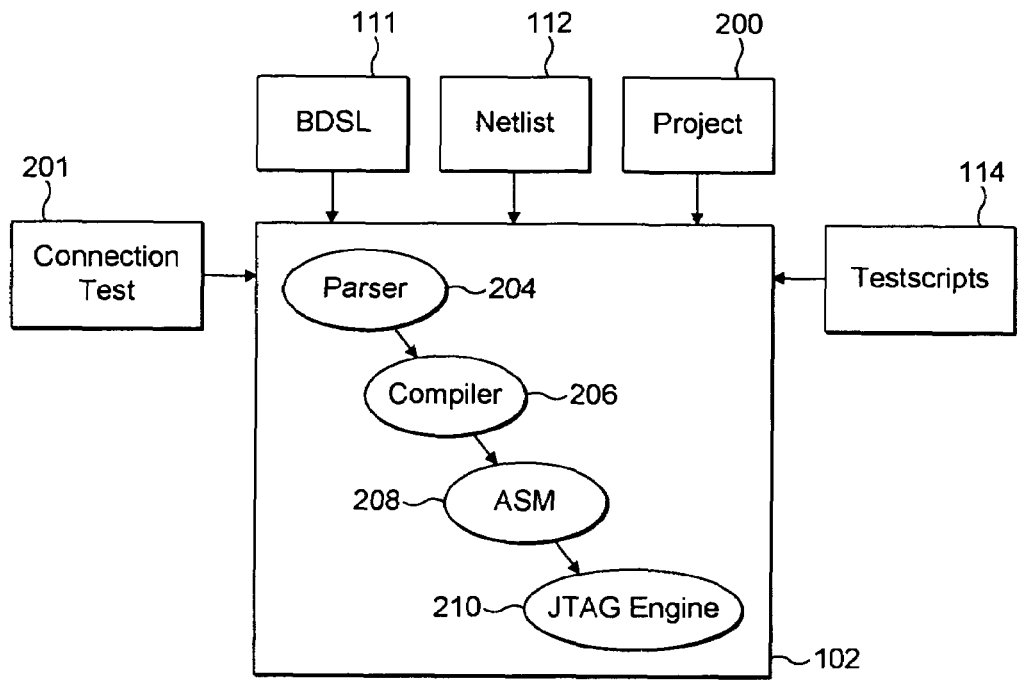
FIG. 3 illustrates in more detail the test software of FIG. 2.

The operation of the software 102 is described in greater detail with reference to FIG. 3. In that Figure, software 102 is seen as receiving the BSDL and netlist files (111 and 112) as well as a project file 200 further defining the specific project to be tested. These files are presented in a high-level language form for operation of the software 102. The files are first parsed in a parser 204, compiled in a compiler 206 and then converted into assembly language in an assembly language module 208. The high-level execution language into which a compiler 206 compiles the files is described in greater detail below. The result of this compilation is a data structure which is ready for performance of a connection test for the complete circuit under development and for execution of test scripts, each specific to an integrated circuit under test. The data structure is able to call a JTAG engine 210 which determines that the code is being executed within a particular file in respect of a particular integrated circuit. The JTAG engine will work through the netlist to find the best place from which to drive a particular pin to perform a particular test. This is described in greater detail below.

Figure 4:
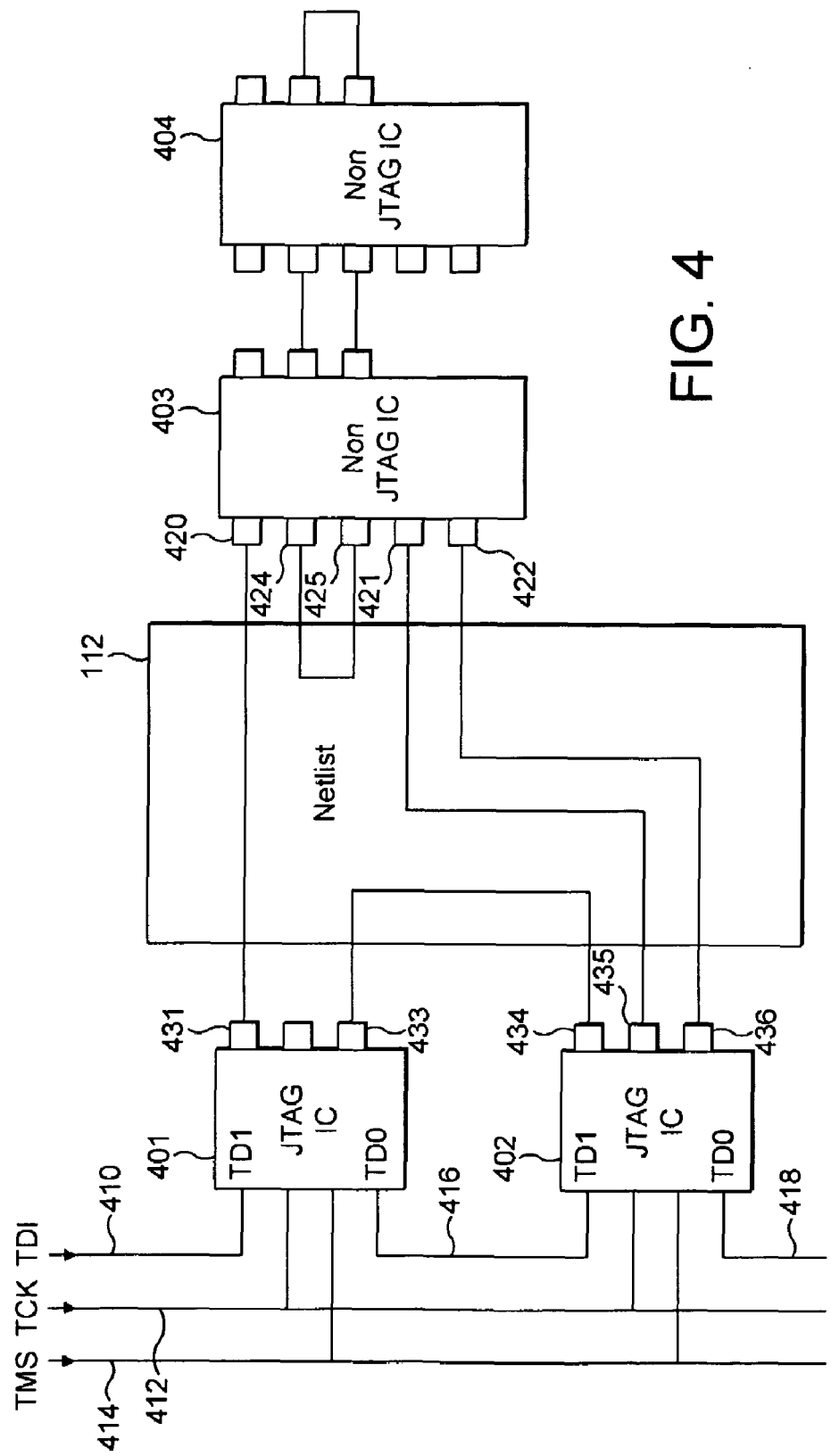
FIG. 4 illustrates a circuit board to be tested having multiple ICs mounted thereon.

An example of a typical data structure is given below, and by way of brief explanation a typical operation of the software will be the performance of a test, which may be a connection test 201 or an IC-specific script 114 which will set a pin to a given number. This instruction is compiled by the compiler 206 into a set of instructions that write data using the JTAG chain to internal variables and call the JTAG engine. The JTAG engine works through the netlist to find the best place from which to drive the desired pin and drives that pin by "writing" a JTAG chain that will set the necessary pins to perform the test. The software 102 performs a call which will read back a result from the selected pins and determine whether the test has passed or failed. The above steps are repeated to complete an entire test sequence. To further illustrate the preferred embodiment, an example of a circuit to be tested is illustrated in FIG. 4. In this example, there are two JTAG-capable ICs 401 and 402, which are connected to a non-JTAG IC 403, which is further connected to another non-JTAG IC 404. Connected to the first of these ICs is a test data input (TDI) line 410, a test clock (TCK) line 412 and a test mode select (TMS) line 414. The TMS and TCK lines are also connected to IC 402. The TDI line 410 is connected to a TDI input of IC port 401. Lines 410 to 414 are connected to the processor 110 pad the connector 112 via the adapter 105. A further line 416 connects a test data output (TDO) of IC 401 to a TDI of IC 402. A TDO for IC 402 emerges at the bottom of the Figure as line 418. This may be connected to a further JTAG-capable device to continue the chain, or it may be connected to the connector 112 for returning data to the processor 110.

In FIG. 4, the connections between the ICs 401, 402 and 403 are shown as passing through the netlist 112. The connections are, of course, physical connections, but FIG. 4 represents them as logical connections defined in the netlist 112. The connections between ICs 403 and 404 and other connections shown are also defined in either the netlist 112 or the connection list 113. There may be multiple boards of the type shown in FIG. 4, which can all be tested together. For example, there may be multiple ICs 401 and multiple netlists 112 spanning different boards, with a common JTAG bus passing from board to board in a continuous chain.

In operation, a sequence of data is clocked into the TDI line 410 using the TCK line 412. The example will be given in which a test script specific to IC 403 is to be run. In this example, a particular sub-test requires that pin 420 is set to "one" and pins 421 and 422 are to be set to "zero". For this to occur, the software 102, using the netlist 112, identifies that pins 431, 435 and 436 need to be driven high, low and low, respectively. Accordingly, binary four (i.e. 100) is clocked into the TDI line 410 until these values are located in the JTAG register at the locations of pins 431, 435 and 436. When this data has been correctly clocked in, the TMS line 414 is driven such that the data in the boundary scan cells are transferred to the pins 431, 435 and 436. This causes the desired pins 420, 421, 422 to be driven in the desired manner.

There are two important features to note from the above description. First, the manner in which the software 102 causes the pins of IC 403 to be driven is entirely separated from the script. The latter is specific to IC 403 and will cause the testing of that IC. In this way, the testing software is "IC-centric", i.e. the script to test IC 403 can be re-used without modification, even if the netlist 112 is changed or other aspects of the circuit are changed. A second point to note is that as well as testing JTAG capable ICs, the above description allows the testing of an IC 403 that is not JTAG-capable. This is a significant advance in the technology. It is not necessarily the case that the device 403 can be entirely tested. For example, pins 424 and 425 cannot be driven by any JTAG device in the circuit. Nevertheless, it is in practice the case that many of the connections of IC 403 and much of the functionality of that IC can be tested from a JTAG-capable device. Moreover, as will be described below, even a further device 404 that is not connected to any JTAG device can also be tested.

A typical test routine is now described. The test routine has three major phases. The first phase is testing of the JTAG chain itself. It is most important that the connections of the ICs 401 and 402 to the JTAG bus (comprising lines 410 to 418) are intact and there are no short-circuits. If there are breaks in this chain, it may be impossible to perform any further testing. On the other hand, it is an advantage of the present arrangement that a transposition of any connections in this chain at the connector can readily be compensated in the software by a mere transposition of the logical connections at the connector.

The second phase of testing is a connection test. This is a very important test to ensure that, as far as can be tested, all other connections between devices in the circuits, are properly connected and that there are no short-circuits.

The third phase of testing is the running of one or more scripts for individual ICs to test the proper functioning of those ICs and the connections to those ICs.

Test scripts are provided for the non-JTAG devices. An example of a test script is a memory test for testing a memory IC. The connection test requires test scripts for each non-JTAG device, to describe how to disable those devices.

An example of a high level test is given in Appendix 1.

Appendix 1 shows an example of a project file 200. It is a project file for testing a circuit that has two JTAG-capable ICs (IC 2 and IC 3) and three ICs that are not JTAG-capable (IC 1, IC 4 and IC 5). In this example, IC 5 is a static RAM of the type HT6116 (a widely available RAM IC), for which there is a corresponding test script file called "HT6116.XJE". This file is shown in greater detail in Appendix 2.

Referring to Appendix 1, the software begins with a list of definitions defining the BSDL files and the script files as well as other definitions. Thus, for example, IC 2 has a BSDL file called "XC9536XL CS48.BSD". This instructs the software to reference that BSDL file on each occasion where IC 2 is referenced. As well as the integrated circuit devices, the device list has switches and LEDs and resistors, the operation of which is defined in other files.

Following the device list, there is a short list of connections that can be ignored and there is the connection list, which references connections 113. Following the connection list is a description of the JTAG chain. Between the connection list and the JTAG chain description, it is possible to include further definitions of further boards or circuits that are connected to the demonstration board.

The above describes the compilation of the information, i.e. the data structure, defining the entire board to be tested. There then follows at "main entry point" the execution of a circuit test function. This begins with a connection test. A connection test routine is called, which will test that all testable pins are correctly connected and that there are no short-circuits between pins. If the connection test is unsuccessful, an error result is delivered. Various actions can be taken in response to an error result, described in greater detail below.

Assuming the connection test is passed, the program proceeds to a pull resistor test, which tests that all those pins which are pulled high or pulled low by pull resistors are in their correct states and that they can be over-ridden by being pulled into a different state by another pin. Following the pull resistor test there is a switch test ("Test SW1") that need not be described in detail.

After the switch test there is a test for testing IC5, which is a static RAM. The instruction line 'CALL("IC5", "RunTest")( )(result)' calls the test script for IC5. As set out at the beginning of the program, the test script for IC5 is the file "HT6116.xje". This file is set out in Appendix 2 and is described in greater detail below. At this instruction line, the device-specific test script for the RAM device is called, and if the test is successful, a "memory test passed" message is delivered.

Following the static RAM test, there is: a test for testing IC 1, which is an inverter; a test for testing IC 4, which is an EEPROM; and an LED test. These are further test scripts within a set of test scripts 114. The last of these test scripts has a "do" loop, which waits for the user to press and release a button confirming that a given LED has changed colour. An example of an LED test is set out in greater detail further down in Appendix 1, immediately following the LED test call instruction. It has various sub-functions which need not be described in detail.

The various other scripts that are called by the program of Appendix 1 need not be described in detail, but can be implemented by one of ordinary skill in the art by analogy to the examples given.

The above project file represents a complete testing of the development board 120. It is to be noted that the high level language facilitates altering of the project tests in a simple manner in the event that the development board is changed. If, for example, the functionality of the development board does not change but its physical layout is changed, this will be represented by a different netlist, and the above program can readily be run without alteration merely by swapping out the old netlist and swapping in a new netlist. Similarly, if an IC is replaced with another IC from a different supplier, the above data structure facilitates testing by merely replacing the script for the IC with the new script from the new supplier.

An example of a test script for an IC is now given, by way of example only, with reference to Appendix 2. The example is a script for a static RAM of the type HT6116. The script begins with a description of the pin numbers. These are taken directly from the manufacturer's data sheet. Following the pin descriptions, there is a short disable device description, which disables IC 1 and prevents it from driving the bus to which this IC (IC 5) is connected. There then follows a test coverage section which defines the extent to which the running of this file will test the circuit and defines the limitations of the test (i.e. defines what cannot be tested, such as pins 424 and 425 of FIG. 4).

After the device description, the scripting language begins. A write cycle and a read cycle are executed. These are defined by the IC datasheet. Next there follows a memory test. The main entry point to start the test for the device is the instruction line "RunTest". This sequence of steps first tests the databus, then tests the address bus and finally tests the nOE and nWE lines. These routines are set out in greater detail after the last "END" statement of the RunTest sequence of calls, following the explanation in the code explaining the testing of the address bus.

In the first of these routines, a "walking ones test" is performed in which each address on the address line is cycled through from the first address to the last address and "ones" are written in and read back from those memory locations. The value read back is checked to see that it is correct. If not, an error message is delivered. The sequence is repeated for the "walking zeros" test. Following the address test, there is a data test of a similar nature. After the data test there is the output enable test and the write enable test.

It is an advantage of the high level test software 102 that non-deterministic tests can be carried out. The arrangement is not limited to merely delivering a pass or fail result. For example, the program can wait until an action occurs (e.g. until a user presses a button). Another example is the ability of the software to loop back, for example to re-run a test based upon a revised test assumption.

If, in the course of testing the JTAG chain, it becomes apparent that the input and output of one IC has been transposed with the input and output of another, or if an input is transposed with an output, such an outcome can be corrected by updating the netlist to reflect the actual connections, and the tests can be run as before. The same principle applies if there is a transposition of pins somewhere else in the netlist.

Another example of non-deterministic testing is the ability to jump when a test or part of a test has passed. Thus, when a success result is returned by a test script, this may obviate the need to perform further tests, e.g. because the further tests are superfluous in view of the success result. Such further tests can be selectively omitted based upon the result of a test script.

A further advantage of the ability to loop is in the speed of testing of certain components. For example, in the testing of a flash EEPROM, it is possible to continuously interrogate the EEPROM IC to determine whether flash programming has finished. As soon as flash programming has finished, the program can move on to the next test. It is not necessary to wait for a time-out period to be certain that the test is completed. Continuing to loop until an event has occurred (or until there is a time-out) means that the entire test sequence for a board and its components can be shortened.

The connection test in principle only works automatically with connections to the JTAG devices 401 and 402. It would be useful to perform connection tests to a non-JTAG device (e.g. ICs 403 and 404). By way of example, where an IC is driving an address bus, it may not always be possible to read that same bus. However, it is sometimes possible to do this indirectly, e.g. by reading data expected at that address. In this manner tests on a non-JTAG device can be implied. This is done by writing data to the particular address and reading the data expected at that address using the JTAG connections. An IC such as IC 404 that is entirely separated from the JTAG devices 401 and 402 can also be tested using the test script for IC 403. This is possible by looping data back externally through IC 404, back to IC 403 and then testing the data looped back using the JTAG connections.

Figure 5:
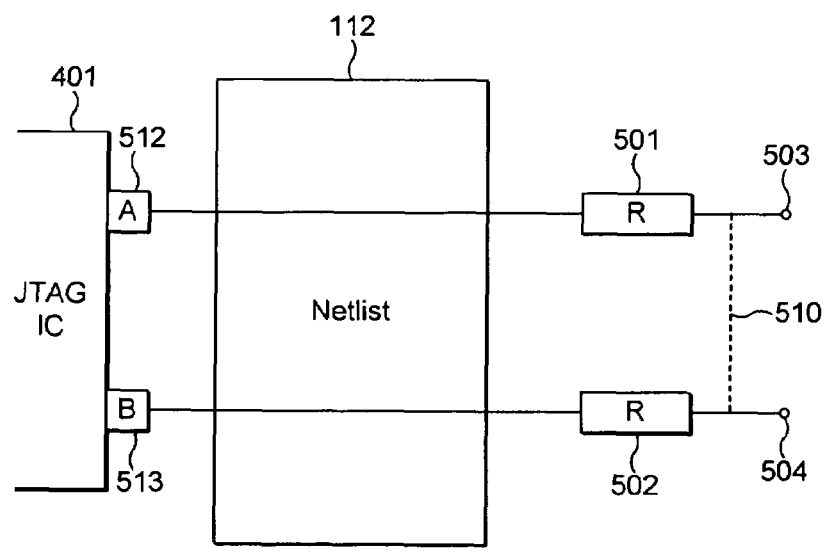
FIG. 5 illustrates a circuit board to be tested having a fault.

A problematic scenario that occasionally needs to be tested is the situation illustrated in FIG. 5. In this Figure, the JTAG IC 401 is connected through the netlist 412 to a pair of resistors 501 and 502, which may be connected to edge connectors (e.g. input or output jacks) 503 and 504, or may be connected to another IC (not shown). A problem arises if there is a short-circuit 510 between the connections 503 and 504. The nets which connect IC 401 to connection 503 and IC 401 to connection 504 are intended to be separate nets. Each of pins 512 and 513 can be driven by the JTAG bus and can be read out by the JTAG bus at the same time. Each pin can take one of three states: high, low and input. Thus, there are eight possible tests that can be conducted with two pins:

TABLE 1

| | |
|---|---|
| A = 1 | read B |
| A = 0 | read B |
| B = 1 | read A |
| B = 0 | read A |
| A = 1 | read A |
| A = 0 | read A |
| B = 1 | read B |
| B = 0 | read B |

In the above table, the pins that are read out in the first four situations will default to a default value (e.g. zero) when there is no short-circuit 510. In the last four situations, the data read out will follow the data written in. If, on the other hand, there is a short-circuit 510 between pins 503 and 504, this will result in the data being read out mirroring the data being written in for all eight situations.

The short-circuit 510 can be tested in another way as illustrated in Table 2.

TABLE 2

| write A | write B | read A | read B |
|---|---|---|---|
| 1 | 1 | 1 | 1 |
| 1 | 0 | 1 | 0 |
| 0 | 1 | 0 | 1 |
| 0 | 0 | 0 | 0 |
| 0 | 1 | 0 | X |
| 1 | 1 | 1 | X |
| 1 | 0 | X | 0 |
| 1 | 1 | X | 1 |

In the above test, where there is no short-circuit 510, the values "X" will default to a default value, for example zero. On the other hand, if there is a short-circuit 510, the values X will mirror the value written to the other pin. (It is also possible that a net is open circuit so that it will read high and low, but will not correlate. This too can be tested.)

In either of the above methods of testing, if the values read out do not equate to the values expected, this is indicative of a fault. The particular nature of the fault is indicated by the values read out. If, for example, there is a short-circuit to ground, this will be indicated by the inability to drive one of the pins high. If, on the other hand, there is a short-circuit between two resistors (as shown in FIG. 5), this will deliver a different result, as described above.

In the overall system described, it is an advantage that it is not necessary that the IC being tested by a particular script is in working mode. The IC can be disabled (by an IC disable pin) and the testing can be carried out. It is not necessary, for example, to have working code loaded into ROM components and other components.

In the course of the connection test, not only does the software ensure that expected data is read back each time a given set of data is written to the JTAG chain, but other, more indirect, tests are performed. For example, if a pattern of ones and zeros is input to a given pin (e.g. pin 433 of FIG. 4) and is expected at pin 434, the software also looks for the same pattern at another pin (e.g. pin 435). If the same sequence of data is read at pin 435, this is indicative of a short-circuit between pins 434 and 435. This correlation test is arranged as part of the connection test described with reference to appendix 1. It requires the clocking in of a plurality of sets of data and loading of these into the boundary scan register and reading back by clocking out in order to fully test all the pins for correlations with other pins to identify erroneous correlations. If a correlation is identified between two pins, this can be tested to see if those pins are genuinely shorted to each other. The test can follow one of the tests outlined in Table 1 or Table 2. Thus the connection test described above can change according to the results that are delivered.

In the development of IC boards, the results of a test can be reviewed and a derivative board and its associated netlist can be created. Without changing the test script, the test method can be performed again on the derivative board.

It has been described how the connection data can be indexed by component (e.g. by IC) but it is also possible to index the connection data by a particular net within the netlist. This is useful for purposes of testing that individual net.

In this manner, the high level language system described looks in an abstracted way at the board to be tested. For example, if there are ten boards with a single JTAG chain, this can be viewed by the software as one JTAG chain. The high level test software 102 keeps the information about the boards separate (by means of the netlists).

The above description has been given by way of example only and modifications of details can be made by one of ordinary skill in the art, without departing from the scope and spirit of the invention.

The invention claimed is:

1. Circuit testing equipment for testing a circuit that has at least one first integrated circuit (IC) that is operatively connected to a boundary-scan bus and at least one second IC that is not operatively connected to the boundary-scan bus, and for testing interconnections between the first IC and the second IC, the equipment comprising:

a computer having stored thereon a boundary scan description language (BSDL) file for the first IC, and a netlist and a connections list for the circuit to be tested, and having loaded therein a test script specific to the second IC and independent of the first IC, the netlist and the connections list, for testing the second IC; and a connector for connecting the computer to the boundary scan bus of the circuit to be tested;

the computer being arranged to parse the BSDL file, the netlist and the connections list, to find points from which selected pins of the second IC can be driven and read via the first IC, and to generate a data structure therefrom which defines pins of the first IC for driving pins of the second IC and pins of the first IC for reading pins of the second IC and which permits automated execution of the test script from the computer through the boundary scan bus to perform tests through the boundary scan bus by driving pins of the first IC to test that interconnections between the first IC and the second IC are properly connected and have no short-circuits.

2. Circuit testing according to claim 1 for testing a connection to a first pin of the second IC, wherein the computer has all information necessary to identify whether the first pin is connected through the netlist to a second pin of the first IC for which a BSDL file is present to control the first pin using the boundary scan bus.

3. Circuit testing equipment according to claim 1, wherein the computer comprises a parser for parsing the BSDL file, the netlist and the connections list, and a compiler for compiling the same to generate the data structure for execution with the test script.

4. Circuit testing equipment according to claim 1, wherein the second IC has pins for adopting one of three states, being a high state, a low state and an input state, and wherein the test script is arranged to sequentially test whether a pin is in a read state by testing whether it can sequentially be driven into the low state and the high state.

5. Circuit testing equipment according to claim 1, wherein the computer further comprises a first test script for testing a first integrated circuit of the circuit to be tested and a second test script for testing a second integrated circuit of the circuit to be tested.

6. The circuit testing equipment according to claim 1, wherein the test script is also associated with other electrical components to be tested, including at least one of switches and light emitting diodes.

7. Circuit testing equipment for testing a circuit that has at least one first integrated circuit (IC) that is connected to a boundary-scan bus, and at least one second IC that is not connected to the boundary-scan bus, the equipment comprising:

an input for inputting files comprising a boundary scan description language (BSDL) file for the first circuit, and a netlist and a connections list, for the circuit to be tested; and a data structure generated by parsing of the BSDL file, the netlist and the connections list to find points from which selected pins of the second IC can be driven and read via the first IC, wherein the data structure defines all pins of the first IC for driving pins of the second IC and all pins of the first IC for reading pins of the second IC, to perform tests through the boundary scan bus by driving pins of the first IC to test that interconnections between the first IC and the second IC are properly connected and have no short-circuits, using a test script that is specific to the second IC but independent of the first IC, the netlist and the connections list.

8. Circuit testing equipment according to claim 7 wherein the first IC has pins for adopting one of three states, being a high state, a low state and an input state.

9. Circuit testing equipment according to claim 7 wherein the first IC is connected to a boundary scan bus.

10. Circuit testing equipment according to claim 7, further comprising a parser and a compiler for parsing and compiling the BSDL file, the netlist and the connections list to generate the data structure, wherein the parser and compiler are implemented in computer programs loaded into a computer to be connected to the circuit to be tested.

11. Circuit testing equipment according to claim 10, wherein the computer further comprises a test script for testing the second IC independent of its connections to the first IC.

12. Circuit testing equipment according to claim 7, wherein the at least one first IC has at least a first pin and a second pin, at least the first pin for adopting one of three states, being a high state, a low state and an input state, the equipment further comprising connection test software arranged to test that the first and second pins are not connected, by setting the first pin to the input state and driving the second pin sequentially into the high and low states.

13. A method of testing, through a boundary scan test bus, a circuit that has at least one first integrated circuit (IC) that is connected to the boundary scan bus and at least one second IC that is not connected to the boundary scan bus the method comprising:

storing:
a boundary scan description language (BSDL) file for the first IC;
a netlist and a connections list for the circuit to be tested; and
a test script specific to the second IC;

parsing the BSDL file, the netlist and the connections list, to find points from which selected pins of the second IC can be driven and read via the first IC, and thereby generating a data structure therefrom which permits automated execution of the test script from the computer through the boundary scan bus;

executing a boundary scan test to test connections between the boundary scan bus and the first IC; and executing a connections test using the data structure to test that interconnections between the first IC and the second IC are properly connected and have no short-circuits.

\* \* \* \* \*